(12) United States Patent
Zhao et al.

(10) Patent No.: US 7,542,293 B2
(45) Date of Patent: Jun. 2, 2009

(54) THERMAL MODULE

(75) Inventors: Liang-Hui Zhao, Shenzhen (CN); Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 340 days.

(21) Appl. No.: 11/308,598

(22) Filed: Apr. 10, 2006

(65) Prior Publication Data
US 2007/0236885 A1  Oct. 11, 2007

(51) Int. Cl.
H05K 7/20 (2006.01)

(52) U.S. Cl. ............... 361/700; 361/702; 361/709; 361/710; 361/711

(58) Field of Classification Search ........... 361/700, 361/709–711, 702
See application file for complete search history.

(56) References Cited

U.S. PATENT DOCUMENTS

| | | | | | |
|---|---|---|---|---|---|
| 5,339,214 | A | * | 8/1994 | Nelson | 361/695 |
| 5,398,748 | A | * | 3/1995 | Yamaji et al. | 165/80.2 |
| 5,549,155 | A | * | 8/1996 | Meyer et al. | 165/104.33 |
| 6,140,571 | A | * | 10/2000 | Kitahara et al. | 174/16.3 |
| 6,469,894 | B2 | * | 10/2002 | Ubukata | 361/700 |
| 6,625,021 | B1 | * | 9/2003 | Lofland et al. | 361/697 |
| 6,781,835 | B2 | * | 8/2004 | Hashimoto et al. | 361/697 |
| 6,900,990 | B2 | * | 5/2005 | Tomioka | 361/752 |
| 7,215,548 | B1 | * | 5/2007 | Wu et al. | 361/703 |
| 2002/0126453 | A1 | * | 9/2002 | Ubukata | 361/720 |
| 2003/0024688 | A1 | * | 2/2003 | Dowdy et al. | 165/80.3 |
| 2003/0183373 | A1 | * | 10/2003 | Sarraf et al. | 165/104.33 |
| 2004/0037045 | A1 | * | 2/2004 | Phillips et al. | 361/719 |
| 2004/0042184 | A1 | * | 3/2004 | Tomioka | 361/752 |
| 2004/0109301 | A1 | * | 6/2004 | Shih-Tsung | 361/829 |
| 2004/0123978 | A1 | * | 7/2004 | Hashimoto et al. | 165/80.3 |
| 2004/0165350 | A1 | * | 8/2004 | Fan | 361/700 |
| 2004/0257770 | A1 | * | 12/2004 | Hu | 361/704 |
| 2005/0099776 | A1 | * | 5/2005 | Xue et al. | 361/700 |
| 2005/0141202 | A1 | * | 6/2005 | Lee et al. | 361/704 |
| 2005/0259405 | A1 | * | 11/2005 | He | 361/729 |
| 2006/0181850 | A1 | * | 8/2006 | Frank et al. | 361/700 |
| 2006/0232934 | A1 | * | 10/2006 | Kusamoto et al. | 361/697 |

FOREIGN PATENT DOCUMENTS

| | | | |
|---|---|---|---|
| GB | 2293446 A | * | 3/1996 |
| JP | 09191440 A | * | 7/1997 |
| TW | 591363 | | 6/2004 |

* cited by examiner

*Primary Examiner*—Anatoly Vortman
(74) *Attorney, Agent, or Firm*—Frank R. Niranjan

(57) ABSTRACT

A thermal module includes a heat spreader (50) for contacting with a heat-generating electronic device mounted on a printed circuit board, a heat sink (60), a heat pipe (70) thermally connecting the heat spreader and the heat sink. A frame (80) is detachably mounted on the heat spreader, for fixing the heat spreader to the printed circuit board so that the heat spreader can thermally contact with the heat-generating device on the printed circuit board. The heat spreader has a simple polygonal configuration. The frame is formed by stamping a metal sheet or plastics injection molding.

4 Claims, 5 Drawing Sheets

THERMAL MODULE

FIELD OF THE INVENTION

The present invention relates to a thermal module having a heat spreader contacting with a heat-generating electronic element mounted on a printed circuit board, wherein a frame detachably mounted on the heat spreader for fixing the heat spreader to the printed circuit board.

DESCRIPTION OF RELATED ART

With the continued development of computer technology, electronic packages such as computer central processing units (CPUs) are generating more and more heat that needs to be dissipated immediately to avoid damage to the circuitry. Therefore, thermal modules are widely used to remove heat from the electronic packages of the computer. Modern electronic packages generate copious amounts of heat. At the same time, modern computers and their electronic packages are continually being miniaturized. Thus, compact thermal modules with good heat dissipation efficiency are increasingly being used.

As shown in FIG. 5, a conventional thermal module includes a base 10, a fin group 20 and a heat pipe 30 thermally connecting the base 10 and the fin group 20. The base 10 is preferably made of copper and has a bottom mating surface 12 for thermally engaging with a heat generating electronic device such as a CPU (not shown) mounted on a printed circuit board (not shown). The base 10 forms four ears 14 extending outwardly from four corners thereof. Each ear 14 defines a through hole 140 therein. The base 10 is attached to the CPU by extending four fasteners (not shown) through the four through holes 140 of the ears 14 to threadedly engage with a retainer attached to the printed circuit board. The base 10 and the ears 14 are integrally formed by machining a copper block. The machining of the conventional base 10 and ears 14 is costly since the base 10 and ears 14 together form a complex configuration and the machining thereof generates a lot of waste material.

A thermal module which overcomes the above-mentioned problems and shortcomings is desired.

SUMMARY OF INVENTION

According to a preferred embodiment of the present invention, a thermal module comprises a heat spreader for contacting with a heat-generating electronic device mounted on a printed circuit board, a heat sink, a heat pipe thermally connecting the heat spreader and the heat sink. A frame is detachably mounted on the heat spreader, for fixing the heat spreader to the printed circuit board so that the heat spreader can thermally contact with the heat-generating device on the printed circuit board. The frame is made by stamping a metal sheet or plastics injection molding. The heat spreader has a simple polygonal configuration. Accordingly, the cost for forming the frame and the heat spreader is low.

Other advantages and novel features of the present invention will become more apparent from the following detailed description of preferred embodiment when taken in conjunction with the accompanying drawings, in which:

DETAILED DESCRIPTION

Figure 1:
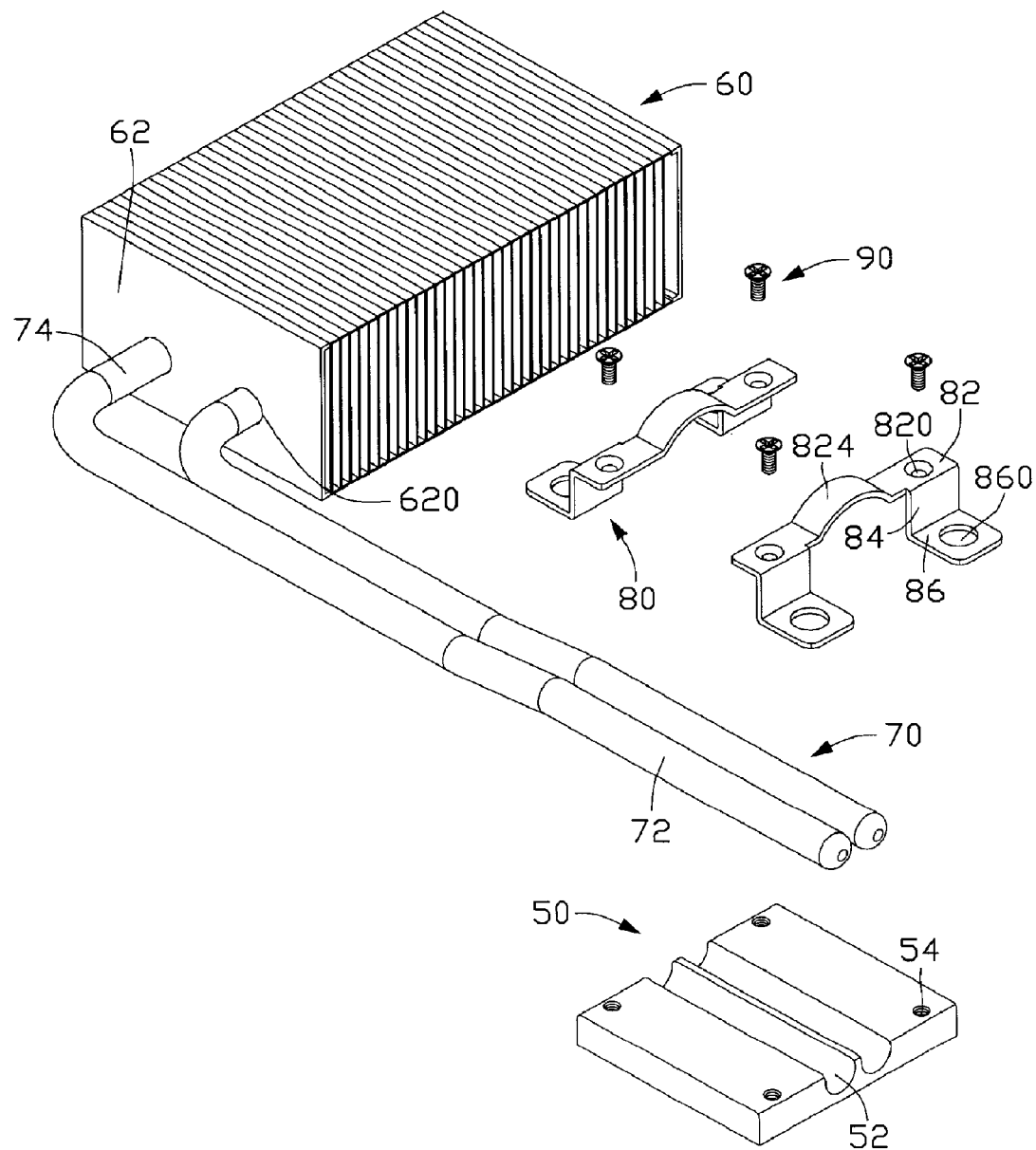
FIG. 1 is a partly exploded, isometric view of a thermal module according to a preferred embodiment of the present invention.
Figure 2:
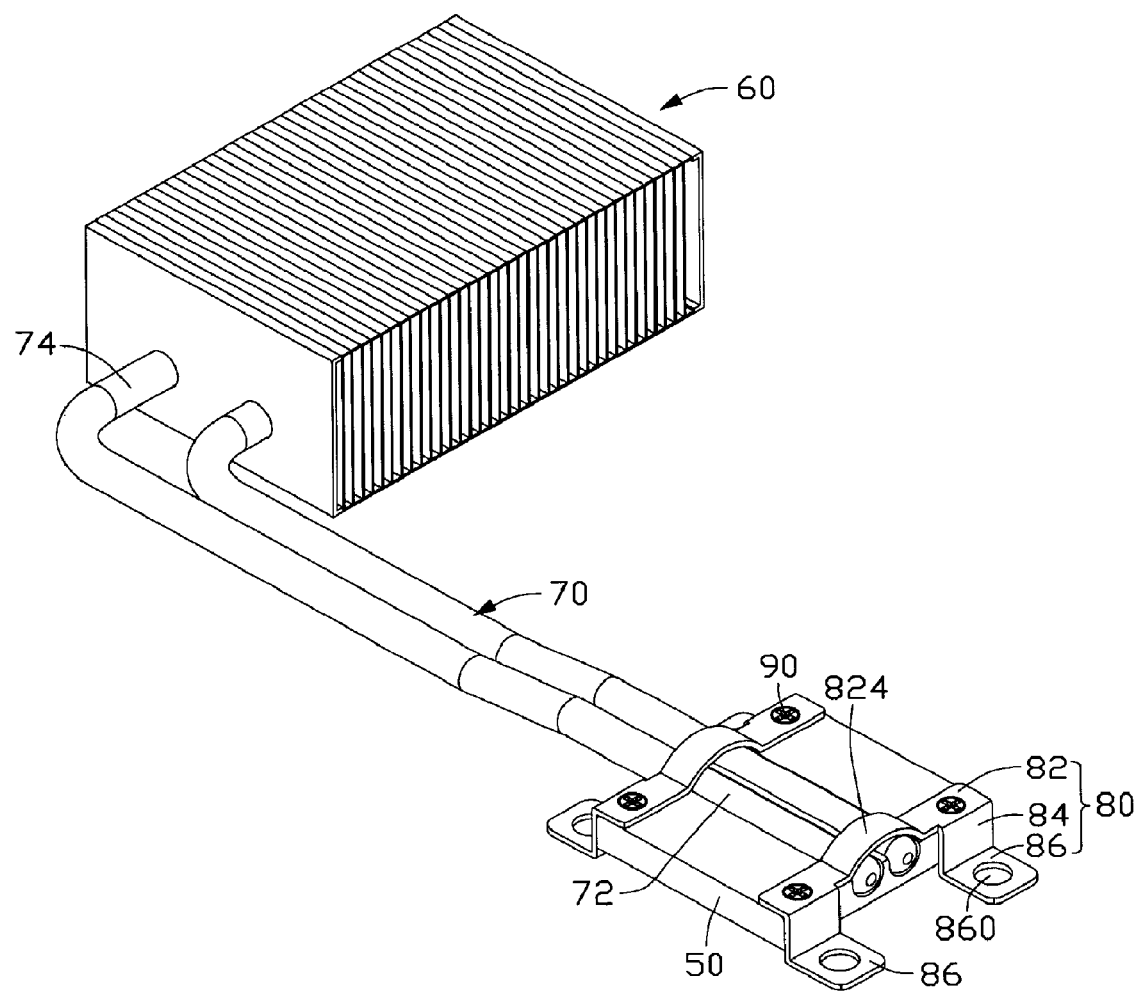
FIG. 2 is an assembled view of FIG. 1.

FIGS. 1 and 2 show a thermal module in accordance with a preferred embodiment of the present invention. The thermal module comprises a heat spreader 50, a heat sink 60 and a pair of parallel heat pipes 70 thermally connecting the heat spreader 50 and the heat sink 60. A pair of frames 80 is detachably mounted at two opposite lateral sides of the heat spreader 50.

The heat spreader 50 is made of metallic material with good heat conductivity such as copper, for thermally engaging with a heat generating electronic device. The heat spreader 50 has a rectangular configuration, and defines a pair of parallel and straight grooves 52 at a central top thereof. A threaded hole 54 is defined at each of four corners of the heat spreader 50.

The heat sink 60 comprises a plurality of fins 62 spaced from and connected with each other. The fins 62 extend perpendicularly to the heat spreader 50. A pair of through holes 620 is defined in the fins 62.

Each of the heat pipes 70 is substantially L-shaped and comprises an evaporating portion 72 received in a corresponding groove 52 of the heat spreader 50 and a condensing portion 74 substantially perpendicular to the evaporating portion 72 and received in a corresponding through hole 620 of the heat sink 60.

The two frames 80 are made of metallic or plastic material, for fixing the heat spreader 50 to a printed circuit board (not shown) having the heat generating electronic device thereon. The frames 80 are respectively and symmetrically mounted at the opposite lateral sides of the heat spreader 50. Each of the frames 80 comprises a body 82, a pair of legs 84 extending perpendicularly from two opposite ends of a lateral side of the body 82 and a pair of tabs 86 extending perpendicularly from free ends of the legs 84. The body 82 and the tabs 86 are located at two different sides of the legs 84. A pair of locating holes 820 is respectively defined in two ends of the body 82, for providing passages of a pair of screws 90 through the body 82. An arced protrusion 824 is formed at a central portion of the body 82, for embracing the evaporating portions 72 of the heat pipes 70 in the grooves 52 of the heat spreader 50. Each tab 86 defines a through hole 860 therein, for providing passage of a fastener (not shown) to fix the heat spreader 50 on the printed circuit board.

In assembly, the evaporating portions 72 of the heat pipes 70 are soldered in the grooves 52 of the heat spreader 50 and the condensing portions 74 of the heat pipes 70 are soldered in the through holes 620 of the heat sink 60. The frames 80 are fixed on the lateral sides of the heat spreader 50 by bring the screws 90 to extend through the locating holes 820 and screw into the threaded holes 54 of the heat spreader 50. Four fasteners (not shown) extend through the through holes 860 of the tabs 86 of the frames 80 to fix the heat spreader 50 onto the printed circuit board such that the heat spreader 50 intimately contacts with the heat generating electronic device.

Figure 3:
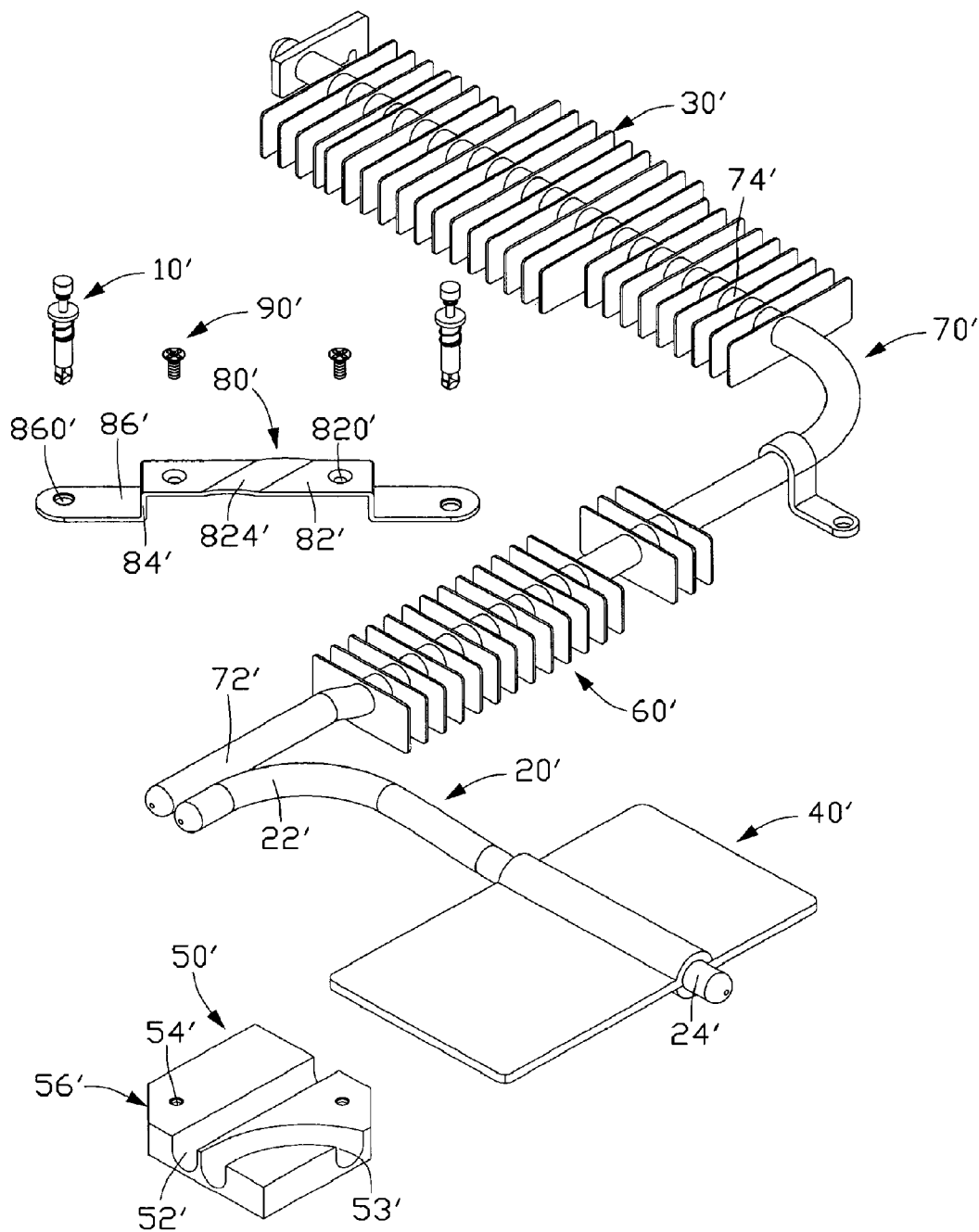
FIG. 3 is partly exploded, isometric view of a thermal module according to an alternative embodiment of the present invention.
Figure 4:
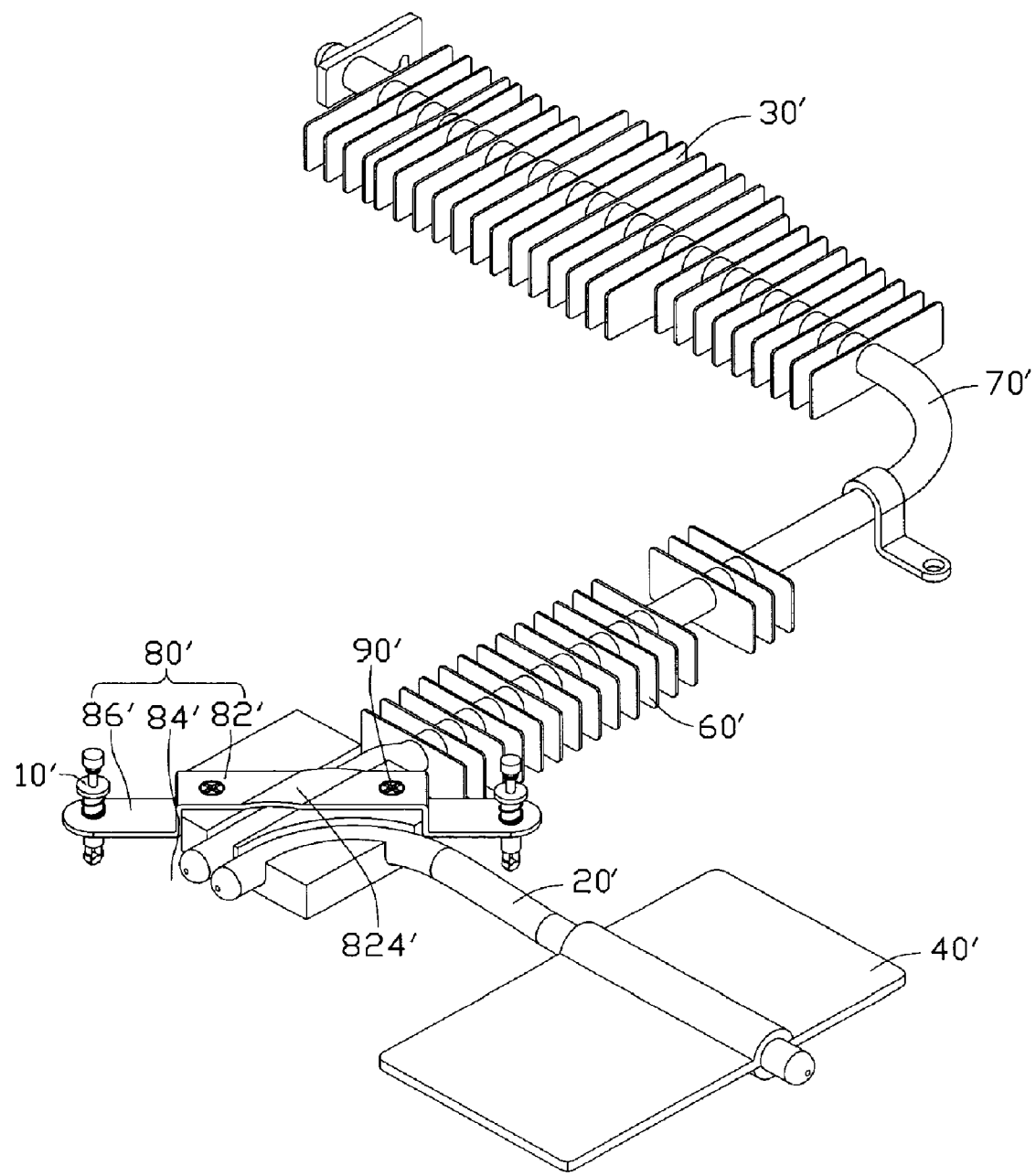
FIG. 4 is an assembled view of FIG. 3.

Referring to FIGS. 3 and 4, a thermal module according to an alternative embodiment of the present invention is shown. The thermal module comprises a heat spreader 50', a heat dissipating board 40', a plurality of first and second fins 60', 30', a first heat pipe 70' thermally connecting the heat spreader 50' and the first and second fins 60', 30', and a second heat pipe 20' thermally connecting the heat spreader 50' and the heat dissipating board 40'. A frame 80' is detachably fixed on the heat spreader 50'.

The heat spreader 50' has a configuration similar to the heat spreader 50 in the preferred embodiment, except that two diagonal corners of the heat spreader 50' are cut off. The heat spreader 50' forms a pair of sidewalls 56' by cutting the two diagonal corners off. A straight groove 52' is defined at a central top thereof. A pair of diagonal threaded holes 54' is defined in a top of the heat spreader 50' and adjacent to the sidewalls 56', respectively. A curved groove 53' adjacent to the groove 52' is defined in the top of the heat spreader 50'.

The first heat pipe 70' is substantially L-shaped and comprises an evaporating portion 72' partly soldered in the groove 52' of the heat spreader 50' and a condensing portion 74' substantially perpendicular to the evaporating portion 72' and extending through the fins 30'. Another part of the evaporating portion 72' extends through the fins 60'. The second heat pipe 20' comprises a curved evaporating portion 22' soldered in the groove 53' of the heat spreader 50', and a condensing portion 24' extending through the heat dissipating board 40'.

The frame 80' is mounted on the heat spreader 50' along a diagonal direction through the threaded holes 54'. The frame 80' forms a substantially rectangular body 82' at a center thereof. The body 82' forms a protrusion 824' covering the evaporating portion 72' of the first heat pipe 70'. A pair of legs 84' extends perpendicularly from two opposite ends of the body 82'. A pair of locating holes 820' is defined in the body 82' near the two opposite ends thereof. A pair of tabs 86' extends perpendicularly and outwardly from ends of the legs 84'. Each tab 86' defines a through hole 860' therein, for providing passage of a fastener 10'. The frame 80' is fastened to the heat spreader 50' by bring screws 90' to extend through the locating holes 820' and screw into the threaded holes 54'. Simultaneously, the legs 84' of the body 82' abut against the sidewalls 56' of the spreader 50'. Two fasteners 10' extend through the through holes 860' of the tabs 86' of the frames 80' to fix the heat spreader 50' onto the printed circuit board such that the heat spreader 50' intimately contacts with the heat generating electronic device.

Figure 5:
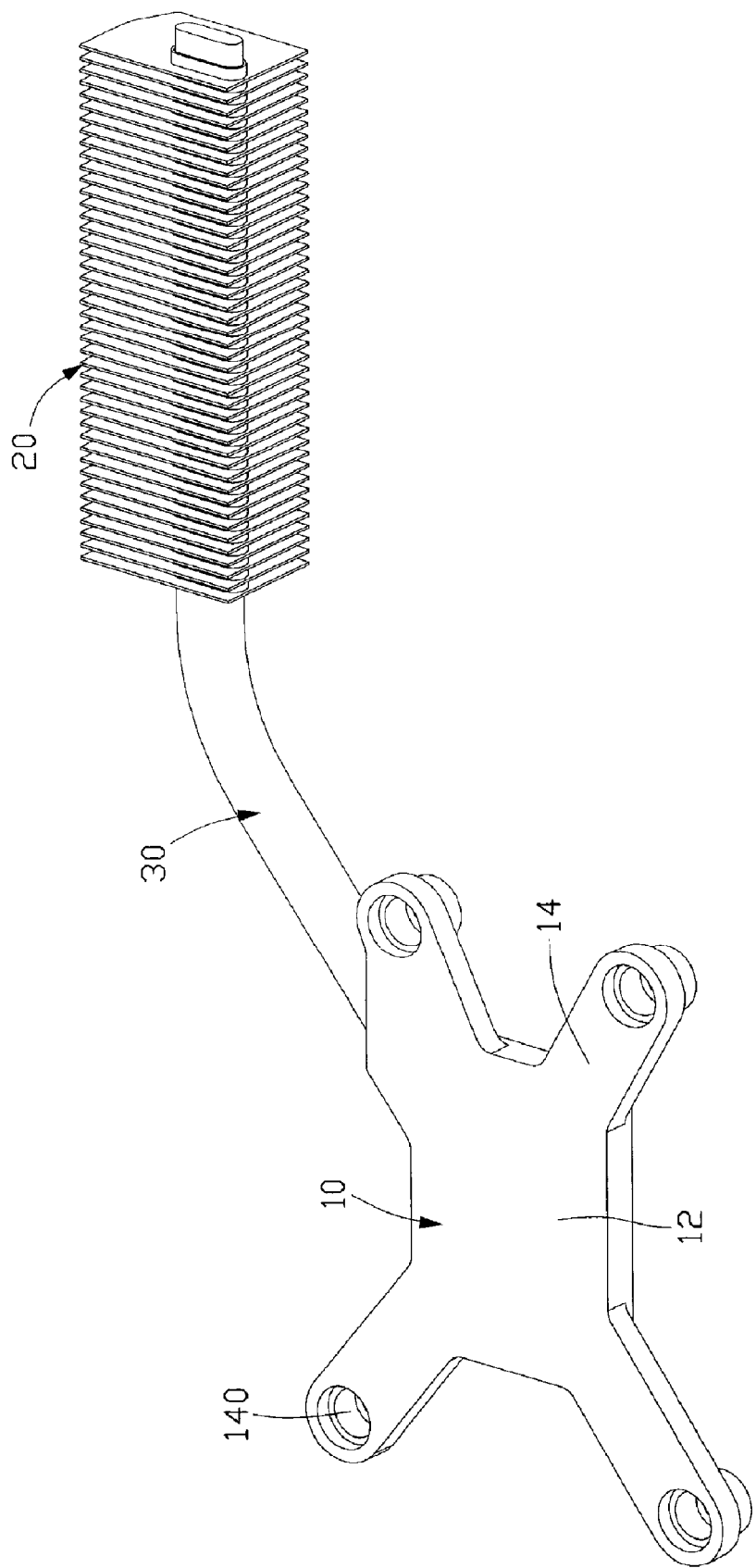
FIG. 5 is a perspective view of a conventional thermal module.

In the present invention, the frames 80, 80' and the heat spreader 50, 50' are separately formed such that the waste of material in machining the base 10 having the ears 14 in the related art of FIG. 5 is prevented and a cost of the heat spreader is lowered. The frames 80, 80' each are formed by stamping a metal sheet or plastics injection molding. The heat spreaders 50, 50' each have a simple polygonal configuration. Accordingly, the formation of the frames 80, 80' and the heat spreaders 50, 50' is quit simple and has a lower cost in comparison with the conventional art.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A thermal module comprising:
   a heat spreader having a bottom surface adapted for contacting a heat-generating electronic device mounted on a printed circuit board;
   a frame comprising a body mounted on a top surface of the heat spreader, a pair of legs extending from the body and abutting against lateral sides of the heat spreader, and a pair of tabs extending from ends of the legs adapted for connection with the printed circuit board;
   a heat pipe and a heat sink, the heat pipe having an evaporating portion and a condensing portion, wherein the evaporating is received in the heat spreader, and the condensing portion is received in the heat sink; and
   a second heat pipe and a heat dissipating board, the second heat pipe thermally connecting the heat spreader with the heat dissipating board.

2. The thermal module as described in claim 1, wherein the body of the frame covers across the evaporating portion of the heat pipe.

3. The thermal module as described in claim 1, wherein two diagonal corners of the heat spreader are cut off, and the frame is fixed on the heat spreader along a diagonal direction through the two diagonal corners.

4. A thermal module comprising:
   a rectangular heat spreader adapted for thermally contacting with a heat generating electronic component mounted on a printed circuit board;
   a heat sink having a plurality of fins;
   a heat pipe thermally connecting the heat spreader and the heat sink together;
   at least a frame attached to the heat spreader, having a body embracing an evaporating portion of the heat pipe and a leg extending downwardly from the body and adapted for being secured to the printed circuit board thereby securing the heat spreader to the printed circuit board; and
   a second heat pipe and a heat dissipating board, the second heat pipe thermally connecting the heat spreader with the heat dissipating board;
   wherein two diagonal corners of the heat spreader are cut away, and the at least a frame is attached to the heat spreader along a direction through the two diagonal corners.

* * * * *